(12) United States Patent
Lin

(10) Patent No.: US 11,662,661 B2
(45) Date of Patent: May 30, 2023

(54) EUV PELLICLE WITH STRUCTURED VENTILATION FRAME

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 136 days.

(21) Appl. No.: 17/119,668

(22) Filed: Dec. 11, 2020

(65) Prior Publication Data

US 2021/0240071 A1 Aug. 5, 2021

Related U.S. Application Data

(60) Provisional application No. 62/968,348, filed on Jan. 31, 2020.

(51) Int. Cl.
*G03F 1/64* (2012.01)
*G03F 7/20* (2006.01)

(52) U.S. Cl.
CPC ............ *G03F 1/64* (2013.01); *G03F 7/70983* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| 9,880,462 B2 * | 1/2018 | Choi .................... G03F 1/64 |
| 10,935,882 B2 | 3/2021 | Yanase |
| 11,204,547 B2 | 12/2021 | Ishikawa et al. |
| 2021/0240070 A1 | 8/2021 | De Graaf et al. |

FOREIGN PATENT DOCUMENTS

| TW | 201923447 A | 6/2019 |
| TW | 201947315 A | 12/2019 |
| TW | 202001414 A | 1/2020 |

* cited by examiner

*Primary Examiner* — Christopher G Young
(74) *Attorney, Agent, or Firm* — McDermott Will & Emery LLP

(57) ABSTRACT

A reticle structure includes a reticle having patterned features and a first border section enclosing the patterned features. The reticle structure includes a membrane having a middle section a second border section enclosing the middle section. The reticle structure includes a frame disposed between the membrane and the reticle to mount the membrane over the patterned features of the reticle. The frame creates an enclosure between the reticle and the membrane and encircles the patterned features of the reticle. The frame includes a plurality of holes and the plurality of holes produces a threshold percentage of opening in the frame to maintain an equalized pressure difference between the enclosure and outside the enclosure below a threshold pressure.

20 Claims, 13 Drawing Sheets

EUV PELLICLE WITH STRUCTURED VENTILATION FRAME

PRIORITY CLAIM AND CROSS-REFERENCE

This application claims priority to U.S. Provisional Application No. 62/968,348 filed on Jan. 31, 2020, entitled "EUV Pellicle with structured ventilation frame," the entire disclosure of which is incorporated herein by reference.

BACKGROUND

During an integrated circuit (IC) design, a number of layout patterns of the IC, for different steps of IC processing, are generated. The layout patterns include geometric shapes corresponding to structures to be fabricated on a substrate. The layout patterns may be patterns on a mask that are projected, e.g., imaged, by a radiation source on a photoresist layer on the substrate to create the IC. A lithography process transfers the pattern of the mask to the photoresist layer of the substrate such that etching, implantation, or other steps are applied only to predefined regions of the substrate. Transferring the pattern of the mask to the photoresist layer may be performed using an extreme ultraviolet (EUV) radiation source to expose the photoresist layer of the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
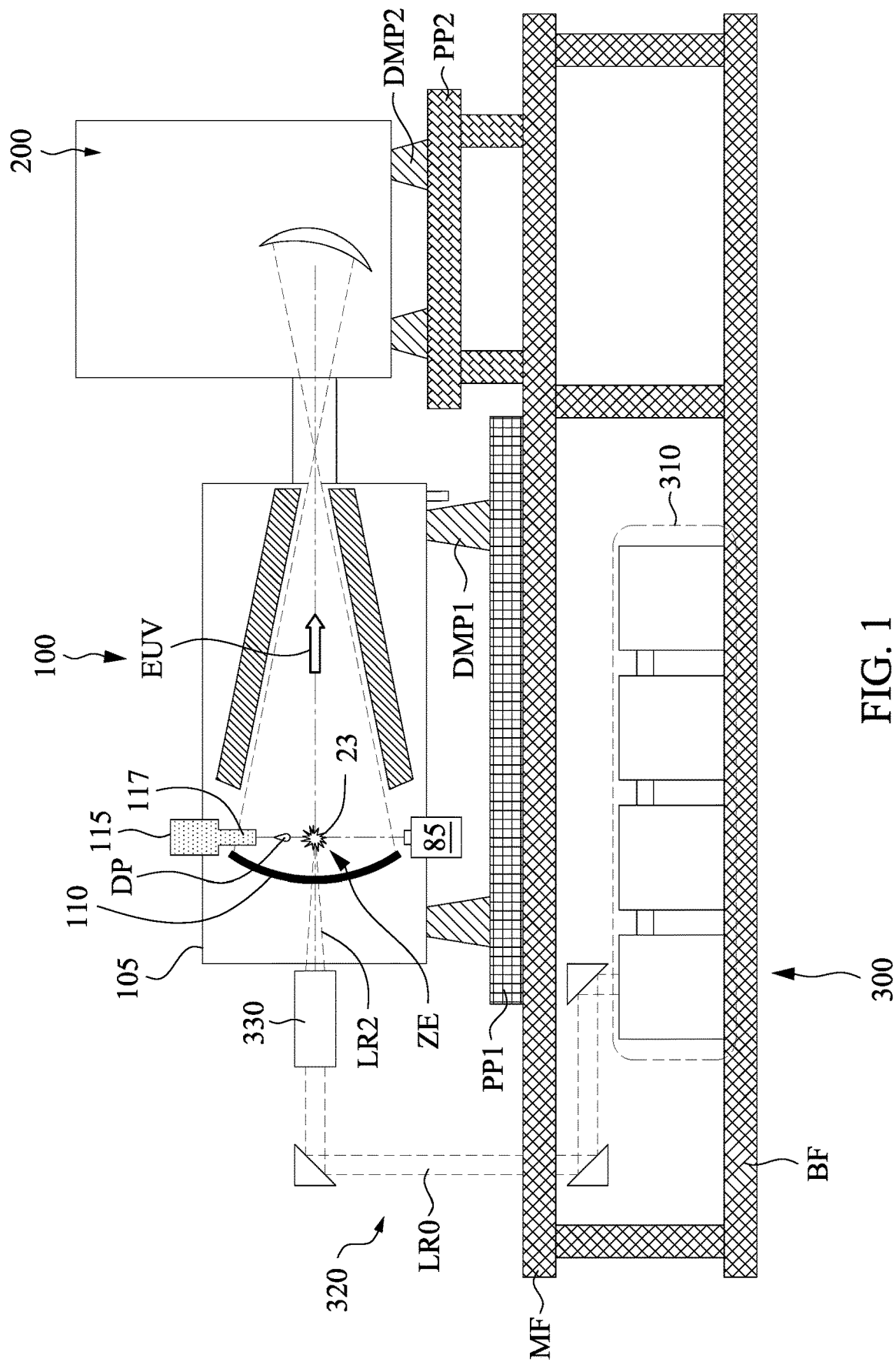
FIG. 1 shows a schematic view of an extreme ultraviolet (EUV) lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

A pellicle is a thin transparent film stretched over a frame that is attached with an adhesive over one side of a photo mask to protect the photo mask from damage, dust, and/or moisture. Thus, it is desirable that the pellicle is highly transparent to the radiation source of the lithography process. In EUV lithography, the pellicle is desirable to be highly transparent in the EUV wavelength region and to have high durability.

When the reticle is covered by a pellicle, the particles sit on the pellicle instead of the reticle and, thus, when the reticle is imaged on a substrate, the particles that are not in the plane of the reticle do not create a focused image on the substrate. The pellicle is about 25 nm to about 125 nm thick layer of material that is transparent to the UV radiation source, e.g., transparent to the DUV or EUV radiation source, of the lithography process. In some embodiments, the pellicle is made of SiC, polysilicon, silicon nitride, or graphene. In some embodiments, when the pellicle is placed, e.g., mounted, on top of the reticle, the pellicle is placed on top of a plurality of studs or fixtures and a distance between about 2 mm to about 5 mm is created between the reticle and the pellicle. Thus, in some embodiments, one or more openings is created by the distance between the reticle and the pellicle and dust particles may enter an enclosure between the reticle and the pellicle. In some embodiments, the pellicle is attached to a mounting fixture and the mounting fixture is attached over the reticle with a number of studs, e.g., four studs at the four corners of the reticle. An opening is created between the pellicle and the reticle where the studs do not exist. Thus, the particles can enter the enclosure between the pellicle and reticle from the opening. Alternatively, the distance between the reticle and the pellicle may be sealed and no opening is created by the distance between the reticle and the pellicle and, thus, no dust particle may enter the space between the reticle and the pellicle.

The UV lithography is performed in an exposure device, e.g., an exposure system, under a vacuum environment in some embodiments. Therefore, sealing the openings between the reticle and the pellicle under atmospheric pressure may produce an enclosure between the reticle and the pellicle with trapped air at atmospheric pressure that may rupture the pellicle when the reticle structure, that is a combination of the reticle with the mounted pellicle, is placed inside the exposure device that is a vacuum environment. In addition, if the openings between the reticle and the pellicle are sealed in a vacuum environment, when the reticle structure is transferred outside the exposure device and placed under atmospheric pressure the pellicle may also be ruptured by the difference between the outside atmospheric pressure and the vacuum inside the enclosure. In addition, in some embodiments, the distance between the pellicle and the reticle is neither completely sealed nor are essentially open but there are few openings in the frame of the pellicle. It is desirable to create some openings, e.g., holes, between the reticle and the pellicle in the mounting fixture (e.g. a frame) that supports the pellicle over the reticle. The openings are distributed as separate openings in the frame that are not connected and each have limited dimensions such that when the pellicle is mounted over the reticle, the dust particles do not easily enter through the holes between the reticle and the pellicle. In addition, the holes of the mounting fixture allows pressure exchange among the enclosure created between the reticle and the pellicle and outside pressure and, thus, the pellicle does not rupture when mask with the pellicle is transferred into the exposure device to be under the vacuum environment or transferred out of the exposure device to be stored under the atmospheric pressure. In some embodiments, for DUV lithography, e.g., for 193 nm lithography, a pellicle structure having a membrane attached on a frame is used. The frame has a few openings for passage of gas between an enclosed space encircled by the frame and closed by the pellicle and the reticle and outside the enclosed space. In some embodiments, due to higher energy of EUV radiation, the EUV exposure device is under higher vacuum environment than the DUV exposure device. Thus, the pellicle structure used in DUV lithography systems may rupture in EUV lithography systems and the openings in the frame needs to be increased so that faster pressure equalization may happen between the enclosed space and outside the enclosed space. In some embodiments, the pressure inside the DUV exposure device or the EUV exposure device is between about 3 to about 5 Pascal.

FIG. 1 shows a schematic view of an EUV lithography system with a laser produced plasma (LPP) EUV radiation source in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2. In some embodiments, a reticle is transferred into the exposure device 200. As noted, the exposure device 200 is maintained under a vacuum environment and the reticle is mounted over a substrate, with a photo resist layer disposed on the substrate. The reticle has a pellicle mounted over the reticle. After transferring the reticle with the pellicle into the exposure device 200, the air pressure in the enclosure between the reticle and the pellicle is equalized with the vacuum environment of the exposure device 200 through the holes in the mounting fixture (the frame). The EUV radiation generated by the EUV radiation source 100 is directed by the optical components to project the mask on the photo resist layer of the substrate. In some embodiments, after the exposure of the mask on the photo resist layer of the substrate, the reticle with the pellicle is transferred out of the exposure device 200. After transferring the reticle with the pellicle out of the exposure device 200, the air pressure in the enclosure between the reticle and the pellicle is equalized with the atmospheric pressure outside the exposure device 200 through the holes in the mounting fixture.

In the present disclosure, the terms mask, photomask, and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask. The mask is described with respect to FIG. 3A.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm in an embodiment. The laser light beam LRO generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the laser beam LR1 is also focused by the focusing apparatus 330.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. A droplet DP that does not interact with the laser pulses is captured by the droplet catcher 85.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp} = d/(t_{rad} - t_o)$$ equation (1).

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2:
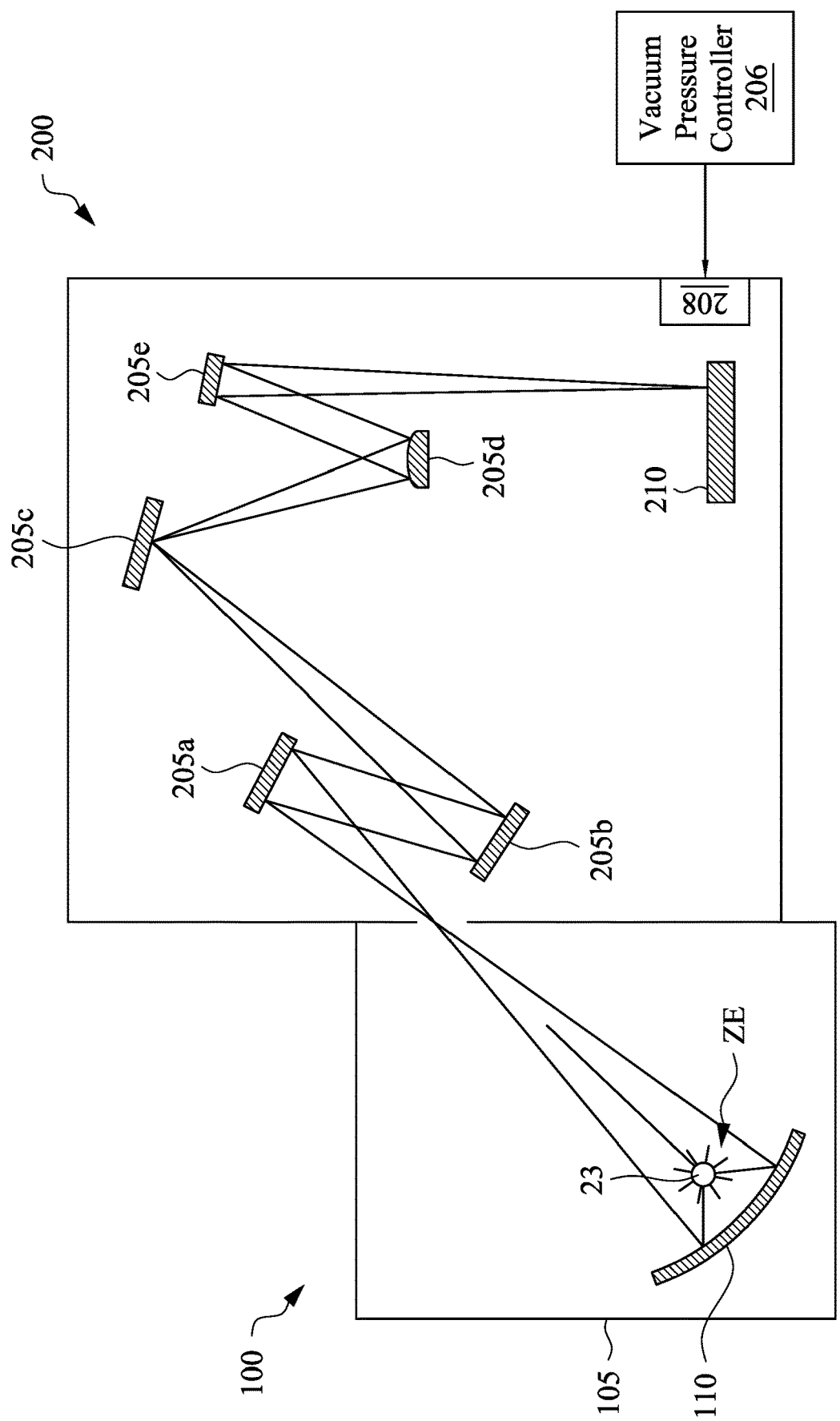
FIG. 2 shows a schematic view of an EUV lithography exposure tool in accordance with some embodiments of the present disclosure.

FIG. 2 shows a schematic view of an EUV lithography (EUVL) exposure tool in accordance with some embodiments of the present disclosure. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., a reflective mask 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210. In some embodiments, a pressure inside the exposure device 200 is sensed by a pressure sensor 208 inside the exposure device 200 and is controlled by a vacuum pressure controller 206 that is coupled to the exposure device 200.

As noted above, because gas molecules absorb EUV light, the lithography system for the EUV lithography patterning, e.g. the exposure device 200, is maintained in a vacuum environment to avoid EUV intensity loss. After transferring the reticle with the pellicle into the exposure device 200, the air pressure in the enclosure between the reticle and the pellicle is equalized with the vacuum environment of the exposure device 200 through the holes in the mounting fixture (the frame) and, thus, vacuum is produced in the enclosure between the reticle and the pellicle. In some embodiments, after the exposure of the mask on the photo resist layer of the substrate, the reticle with the pellicle, the reticle structure, is transferred out of the exposure device 200. After transferring the reticle with the pellicle out of the exposure device 200, the vacuum in the enclosure between the reticle and the pellicle is equalized with the atmospheric pressure outside the exposure device 200 through the holes in the mounting fixture and, thus, atmospheric pressure in produced in the enclosure between the reticle and the pellicle.

Figure 3A:
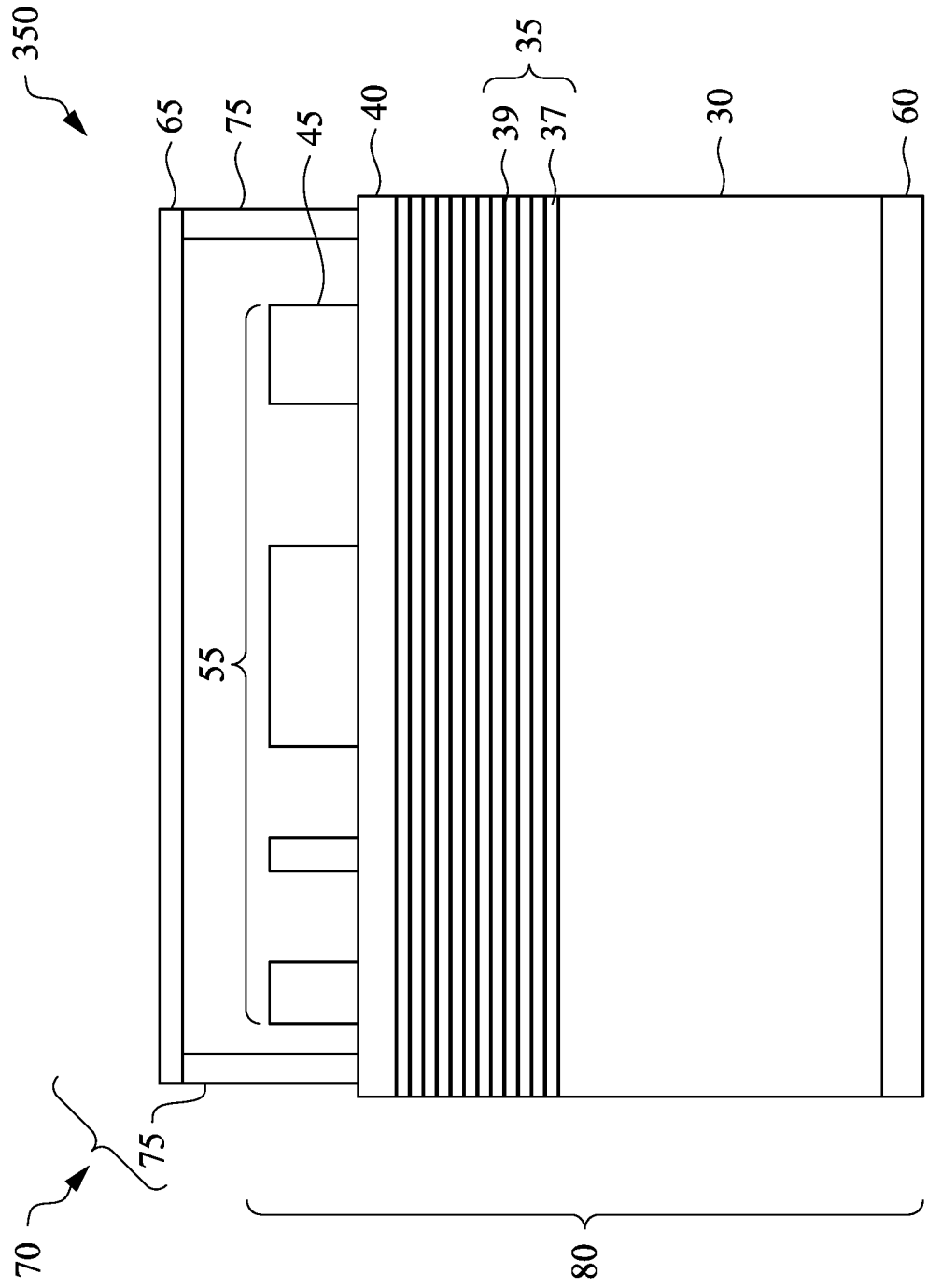
FIGS. 3A and 3B show cross-sectional views of a reflective reticle structure and projecting the reflective reticle structure on a semiconductor device in accordance with some embodiments of the present disclosure.
Figure 3B:
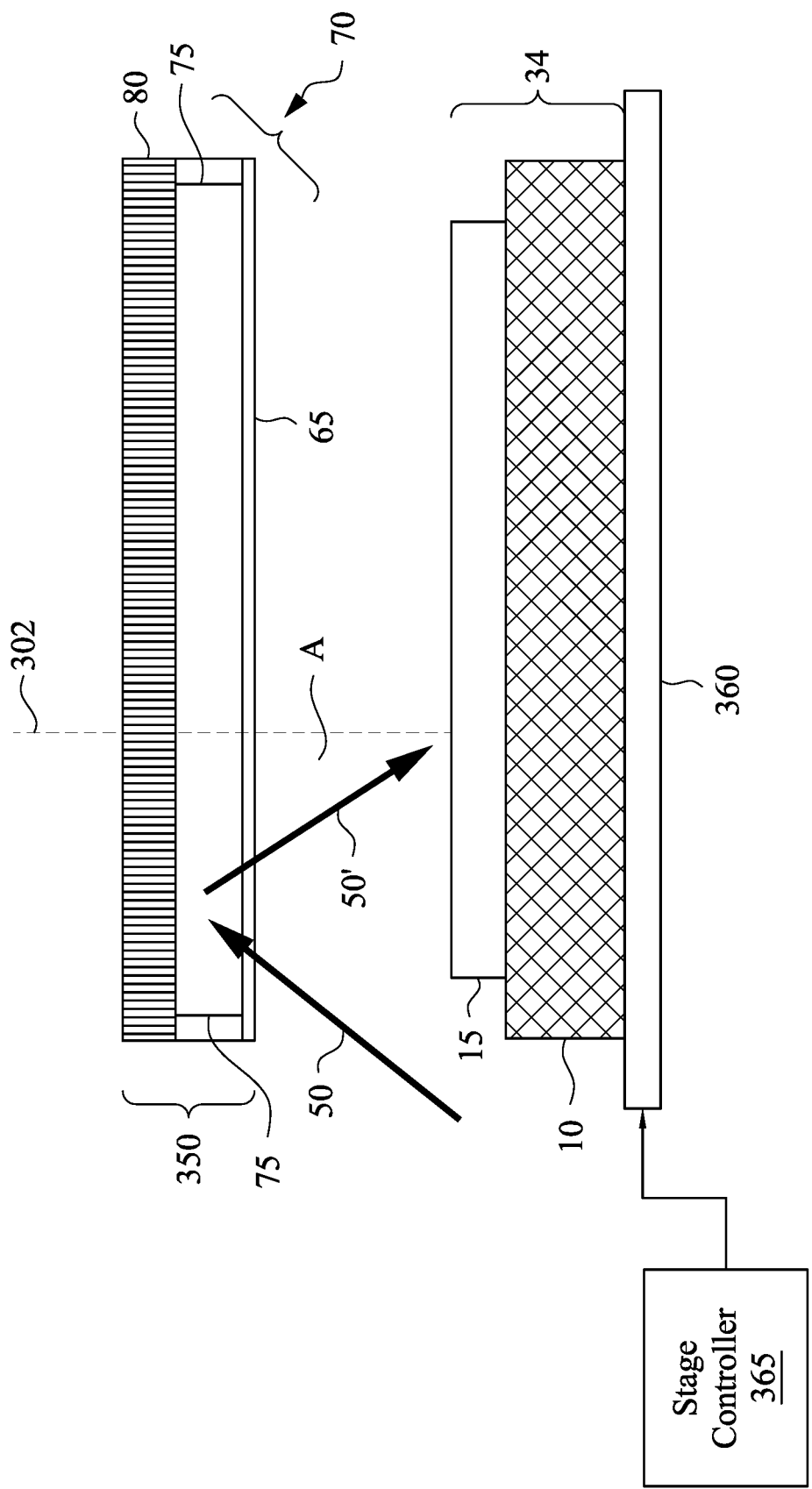

FIGS. 3A and 3B show a cross-sectional view of a reflective reticle structure 350, e.g., a reticle system, and projecting the reflective reticle structure 350 on a semiconductor device in accordance with some embodiments of the present disclosure. FIG. 3A shows a cross-sectional view of a reflective reticle structure 350 that includes a reticle 80, e.g., a reflective mask. As noted above, the terms mask, photomask, and reticle may be used interchangeably. In some embodiments, the reticle 80 is a reflective mask and is used as part of the reflective reticle structure 350. The reflective reticle structure 350 is consistent with reflective mask 205c of FIG. 2 and is used in the exposure device 200 of FIG. 2.

The reflective mask, e.g., the reticle 80, includes a substrate 30, reflective multiple layers (ML) 35 that are deposited on the substrate 30, a conductive backside coating 60, a capping layer 40, and an absorption layer 45. In some embodiments, the material of the substrate 30 includes $TiO_2$ doped $SiO_2$, or other suitable materials with low thermal expansion. In some embodiments, the substrate 30 includes fused quartz and has a thickness between about 6 mm to about 7 mm. In some embodiments, the ML 35 includes a plurality of film pairs, such as molybdenum-silicon (Mo/Si) film pairs (e.g., a layer of molybdenum layer 39 above or below a layer of silicon layer 37 in each film pair). In some embodiments, the ML 35 has 40 to 50 pairs of the molybdenum layer 39 and the silicon layer 37 and each molybdenum layer 39 has a thickness of 3 nm and each silicon layer 37 has a thickness of 4 nm. Thus, in some embodiments, the ML 35 has a thickness between 280 nm to 350 nm. Alternatively, the ML 35 may include molybdenum-beryllium (Mo/Be) film pairs, or other suitable materials that are configured to highly reflect the EUV light. The capping layer 40 may include ruthenium (Ru) and may be disposed on the ML 35 for protection and may have a thickness of 2.5 nm. In some embodiments, the capping layer 40 may include silicon (Si) and may be disposed on the ML 35 for protection and may have a thickness of 4 nm. In some embodiments, the absorption layer 45 that includes a tantalum boron nitride (TaBN) layer is deposited over the ML 35 and the capping layer 40. In some embodiments, the absorption layer 45 is patterned with pattern features 55 to define a layout pattern for layer of an integrated circuit (IC). In some embodiments, the backside coating 60 includes chromium nitride (CrN) or Tantalum boride (TaB) and has a thickness of 20 nm to 100 nm. In some embodiments, another reflective layer may be deposited over the ML 35 and to be patterned to define a layer of an integrated circuit, thereby forming an EUV phase shift reticle. In some embodiments, the absorption layer 45 includes one or a combination of TaBO, TaBN, TaNO, and TaN and has a thickness between 50 nm and 70 nm. In some embodiments, the reflective reticle structure 350 also includes a pellicle structure 70, a mounted structure that includes a membrane 65 mounted on a frame 75. The pellicle structure 70 is described with respect to FIGS. 5A and 5B.

FIG. 3B shows exposing the photoresist of a semiconductor device to radiation in accordance with some embodiments of the present disclosure. FIG. 3B shows the semiconductor device 34 includes a photoresist layer 15 that is disposed on a semiconductor substrate 10. FIG. 3B also shows a radiation beam 50 that is originated from an EUV light source, e.g., EUV light source 100 of FIG. 1. The radiation beam 50 is directed to the reticle 80, e.g., a reflective photomask, where the radiation beam 50' is reflected from the reflective photomask 80 and is incident onto the photoresist layer 15. The incident angle of the radiation beam 50', which is defined with respect to a line 302 that is perpendicular to a top surface of the semiconductor substrate 10 is angle A. As shown in FIG. 3B, the incident radiation beam 50 and the reflected radiation beam 50' pass through the membrane 65 of the pellicle structure 70. In some embodiments, the semiconductor substrate 10, that is consistent with the semiconductor substrate 210 of FIG. 2, is mounted on stage 360 that is coupled to and controlled by a stage controller 365 for moving the semiconductor device 34 and exposing different locations of the semiconductor device 34.

Figure 4:
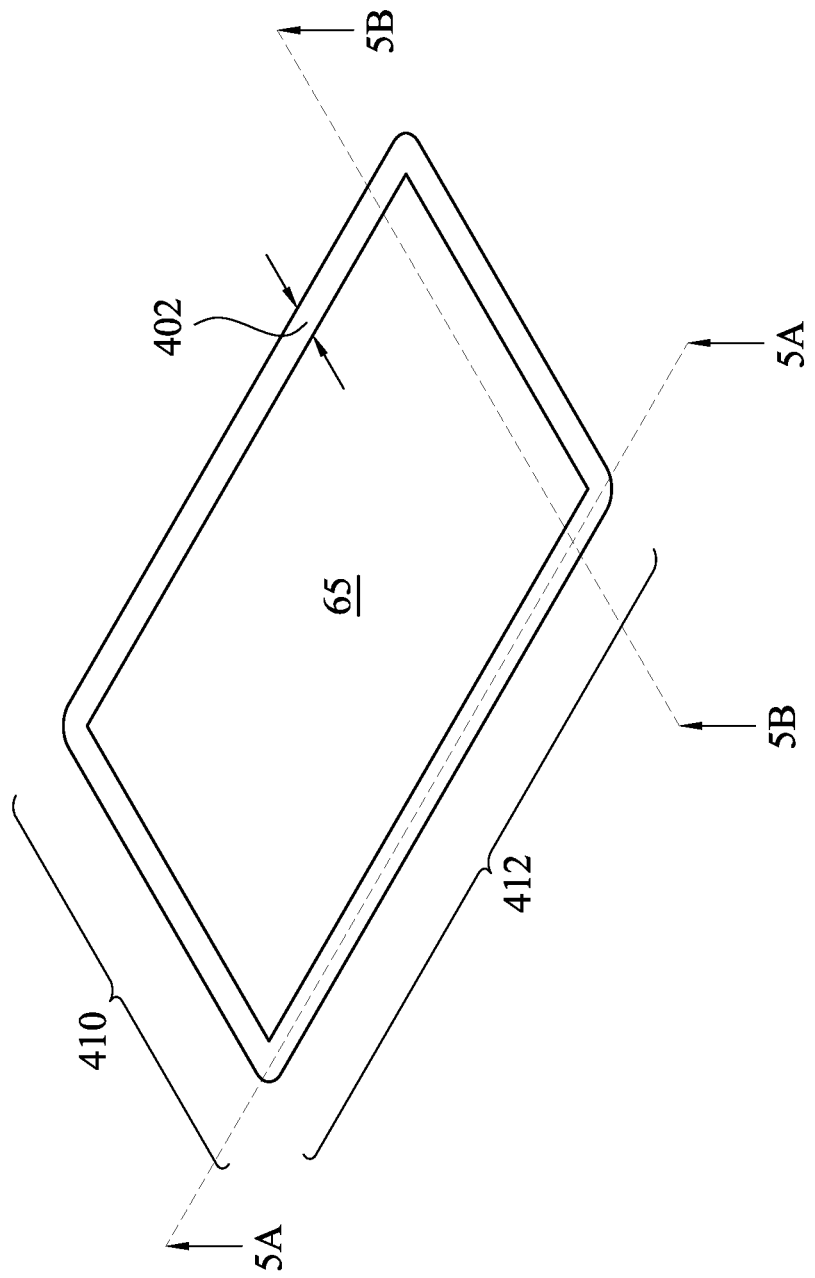
FIG. 4 shows a membrane having a border.

FIG. 4 shows the membrane 65, e.g., a transparent membrane, of a pellicle having a border section 402. FIG. 4 shows the back side of the membrane 65 (facing to the reticle) with a border layer 507 disposed on the border section 402 over the back side of the membrane 65. As shown in the below FIGS. 5A and 5B, the membrane 65 is attached on a frame 504 from the back side and the border layer 507 at the border section 402 is in contact with the frame 504. As discussed, the membrane 65 is about 25 nm to about 125 nm thick layer of a material that is transparent to the UV radiation source, e.g., transparent to the DUV or EUV radiation source of the lithography process. In some embodiments, a width 410 of the membrane 65 is between about 50 mm to about 100 mm and a length 412 of the membrane 65 is between about 100 mm and about 200 mm. FIG. 4 additionally shows cross-sectional cut lines 5A-5A and 5B-5B corresponding to the cross-sectional FIGS. 5A and 5B. In some embodiments, the border layer 507 disposed on the border section 402 of the membrane 65 includes silicon (Si). In some embodiments, another layer (not shown) that includes one or more of elements Ru, Mo, Zr, B, Nb, Ir, Ti, the oxide of the elements, or the oxynitride of the elements is disposed over the membrane 65 on opposite side of the border layer 507 for heat dissipation.

Figure 5A:
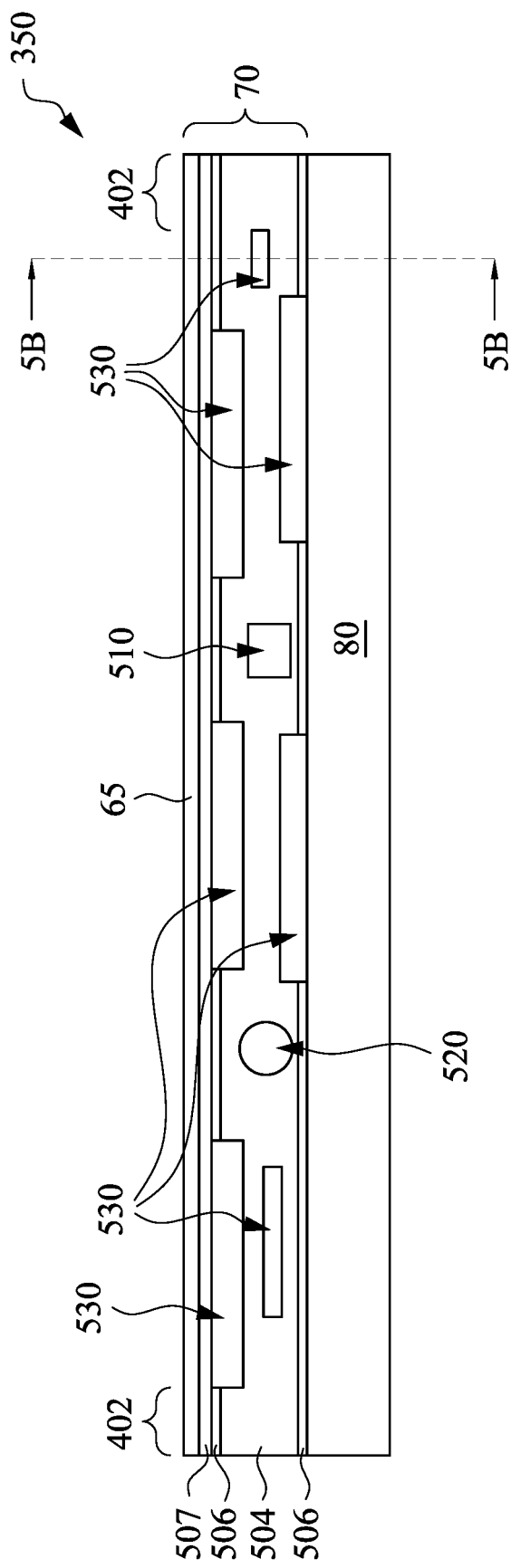
FIGS. 5A, 5B, and 5C show a reticle structure having a pellicle structure on a reticle, the pellicle structure having a membrane mounted over a frame in accordance with some embodiments of the present disclosure.
Figure 5B:
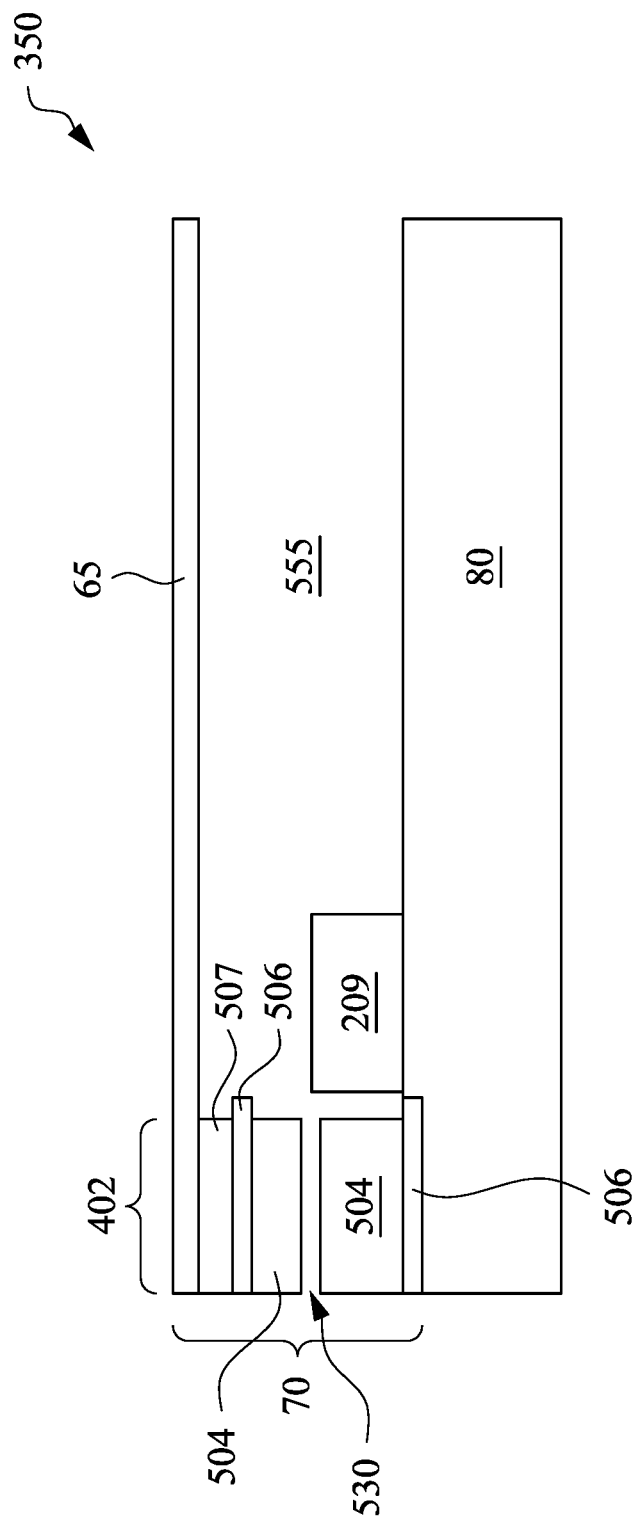
Figure 5C:
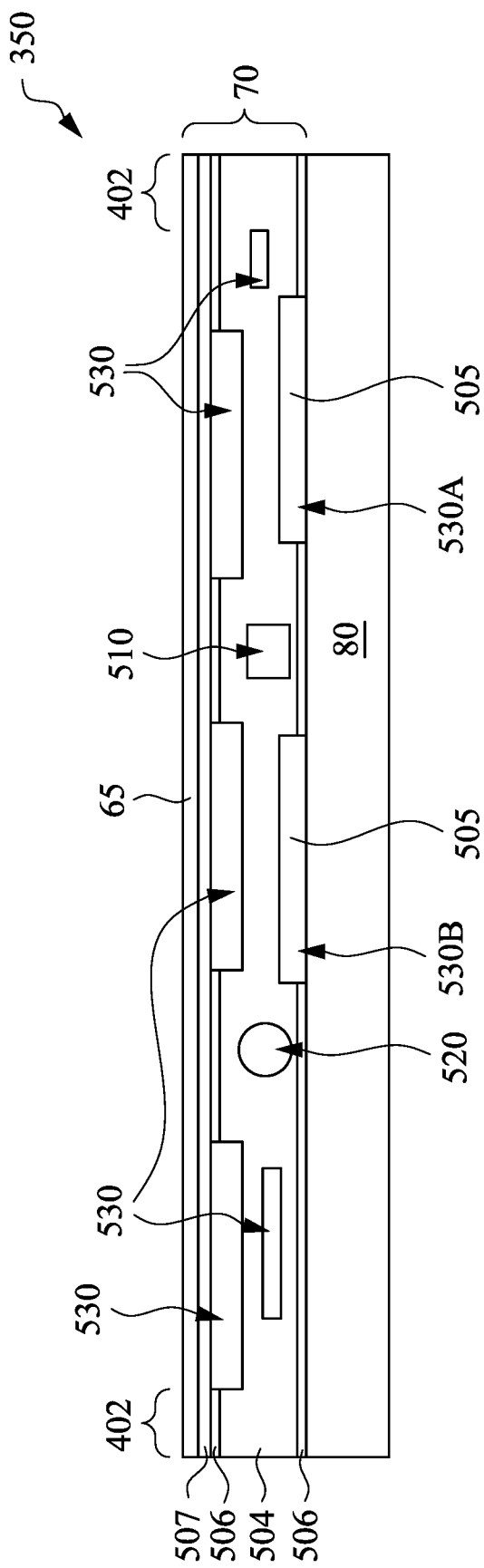

FIGS. 5A, 5B, and 5C show a reticle structure 350 having a pellicle structure 70 on a reticle 80, the pellicle structure 70 having a membrane 65 mounted over a frame 504 in accordance with some embodiments of the present disclosure. The frame 504 is consistent with the frame 75 of FIG. 3A. FIG. 5B is a cross-sectional view through the plan 5B-5B of FIG. 5A. FIGS. 5A and 5B show the membrane 65 mounted at the border section 402 via the border layer 507 and an adhesive 506 to the frame 504 to create the pellicle structure 70. The pellicle structure 70 is mounted on a reticle 80 via the adhesive 506, e.g., a double sided adhesive. In some embodiments, the frame 504 surrounds a layout pattern (not shown) on top of the reticle 80 and creates an enclosure 555 between the reticle 80 and the membrane 65 over the layout pattern. In some embodiments, the border layer 507 at the border section 402 of the membrane 65 at the back side is attached to one side of the frame 504 by the adhesive 506. In some embodiments, the other side of the frame 504 is attached by the adhesive 506, e.g., a double sided adhesive, to the reticle 80. In some embodiments as shown in FIG. 5A, the frame 504 includes a plurality of holes with different shapes, e.g., square holes 510, slit holes 530, or circular holes 520. Thus, air can travel in and out of the enclosure 555 via the square holes 510, the slit holes 530, and the circular holes 520. In some embodiments, the slit hole 530 is fully enclosed by or embedded in the frame 504. In some embodiments, one side of the slit holes 530 is formed by the membrane 65 or the reticle 80. In other embodiments, top and bottom sides of the slit holes 530 are formed by the membrane 65 and the reticle 80. In some embodiments, the slit holes 530 have a height of about 0.5 mm to 2 mm and a length of about 1 mm to 10 mm. In some embodiments, the square holes 510 have a side of about 0.5 mm to 5 mm and the circular holes 520 have a diameter of about 0.5 mm to 5 mm. In some embodiments, the thickness or the diameter of the holes is constant. In other embodiments, the holes have a tapered shape toward inside or outside the pellicle. In some embodiments, the holes are bent more than once from the outside to the inside the pellicle (e.g., a crank shape). In some embodiments, the total number of holes are between about 20 holes to about 200 holes at all sides. In some embodiments, the total opening areas of the holes is between about 6 percent to about 15 percent of the surface area of the frame 504. In some embodiments, the total opening areas at the four sides are substantially equal to each other. In some embodiments, a thickness of the frame 504 is the width of the border section 402 and is between about 2 mm to 5 mm. As described, the square holes 510, the slit holes 530, and the circular holes 520 prevent a rupture of the membrane 65 when the reticle structure 350 undergoes a sudden pressure change. In some embodiments, the holes are either slit holes, square holes, or circular holds. In some embodiments, the holes have a same diameter between 0.5 mm and 1 mm and are uniformly distributed in the sided of the frame.

In some embodiments, the dust particles may enter through the square holes 510, the slit holes 530, or the circular holes 520. Thus, an air filter may be disposed in one or more of the square holes 510, the slit holes 530, or the circular holes 520 to prevent the dust particles from entering the enclosure 555. FIG. 5C is similar to FIG. 5A with the difference that two of the slit holes, e.g., slit holes 530A and 530B, with the reticle 80 as a border have an air filter 505 in the slit holes 530A and 530B to prevent particles from passing through the slit holes 530A and 530B. In some embodiments, a thickness of the of the frame 504 is increased or the location of the square holes 510, the slit holes 530, and the circular holes 520 optimized to minimize the chance of a particle to enter the enclosure 555. In some embodiments, a height of the enclosure 555 is between about 2 mm and about 5 mm. In some embodiments, the pellicle structure 70 is reusable and thus the pellicle structure 70 may be detached from the mask, e.g., from the reticle 80 and reused in another reticle structure. In some embodiments, the membrane 65 is reusable and thus the membrane 65 may be detached from the pellicle structure 70 and reused in another pellicle structure.

Figure 6:
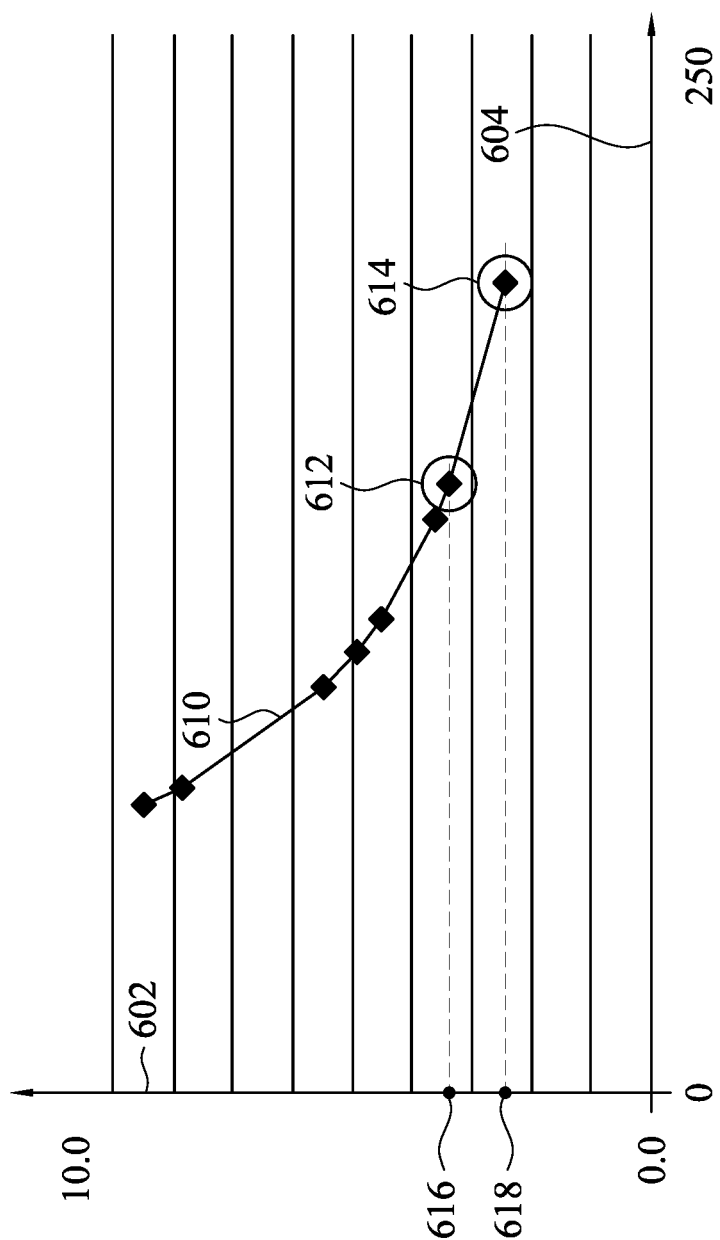
FIG. 6 shows a graph of a pressure difference between inside the reticle structure and outside the reticle structure versus number of holes of the frame of the reticle structure in accordance with some embodiments of the present disclosure.

FIG. 6 shows a graph 610 of a pressure difference on coordinate 602 that ranges between zero and 10.0 (in Pascal) between inside the enclosure 555 and outside the enclosure 555 versus the number of holes on coordinate 604 that ranges between zero and 250 (e.g., equal shape and size holes) of the frame 504 of the reticle structure in in accordance with some embodiments of the present disclosure. In some embodiments, the pressure difference between the enclosure 555 and outside the enclosure 555 is measured when the pressure between the enclosure 555 and outside the enclosure 555 is equalized. In some embodiments, the graph 610 corresponds to the reticle structure 350 of FIG. 3A. As shown, when the number of holes is about 150 at point 612, the pressure difference between inside and outside the enclosure 555 is about less than 3.5 Pascal (point 616), and when the number of holes is about 200 at point 614, the pressure difference between inside and outside the reticle structure is about less than 2.5 Pascal (point 618).

As noted, the pressure difference of FIG. 6 between inside and outside the enclosure 555 is measured when the reticle structure is transferred out of the exposure device 200 to the atmospheric pressure outside the exposure device 200 and the pressure is equalized between the enclosure 555 and outside the enclosure 555. In some embodiments, the pressure difference between inside and outside the enclosure 555 is measured when the reticle structure is transferred from the atmospheric pressure outside the exposure device 200 to the exposure device 200 and the pressure is equalized between the enclosure 555 and the vacuum outside the enclosure 555. In some embodiments, the pressure the enclosure 555 and outside the enclosure 555 is equalized after a threshold time. In some embodiments, the threshold time is defined between about 10 seconds to about 30 seconds. In some embodiments, the vacuum pressure controller 206 of FIG. 2 is coupled to a pressure sensor 208 inside the exposure device 200 and is also coupled to another pressure sensor 209 inside the enclosure 555 of the reflective reticle structure 350, which is consistent with the reflective mask 205c. The pressure sensors 208 and 209 are either coupled with wire or wirelessly to the vacuum pressure controller 206. The vacuum pressure controller 206 determines the pressure difference between the enclosure 555 and outside the enclosure 555 when the reflective reticle structure 350 is inside the exposure device. Also, the vacuum pressure controller 206 determines the pressure difference between the enclosure 555 and outside the enclosure 555 when the reflective reticle structure 350 is in the atmospheric pressure.

Figure 7:
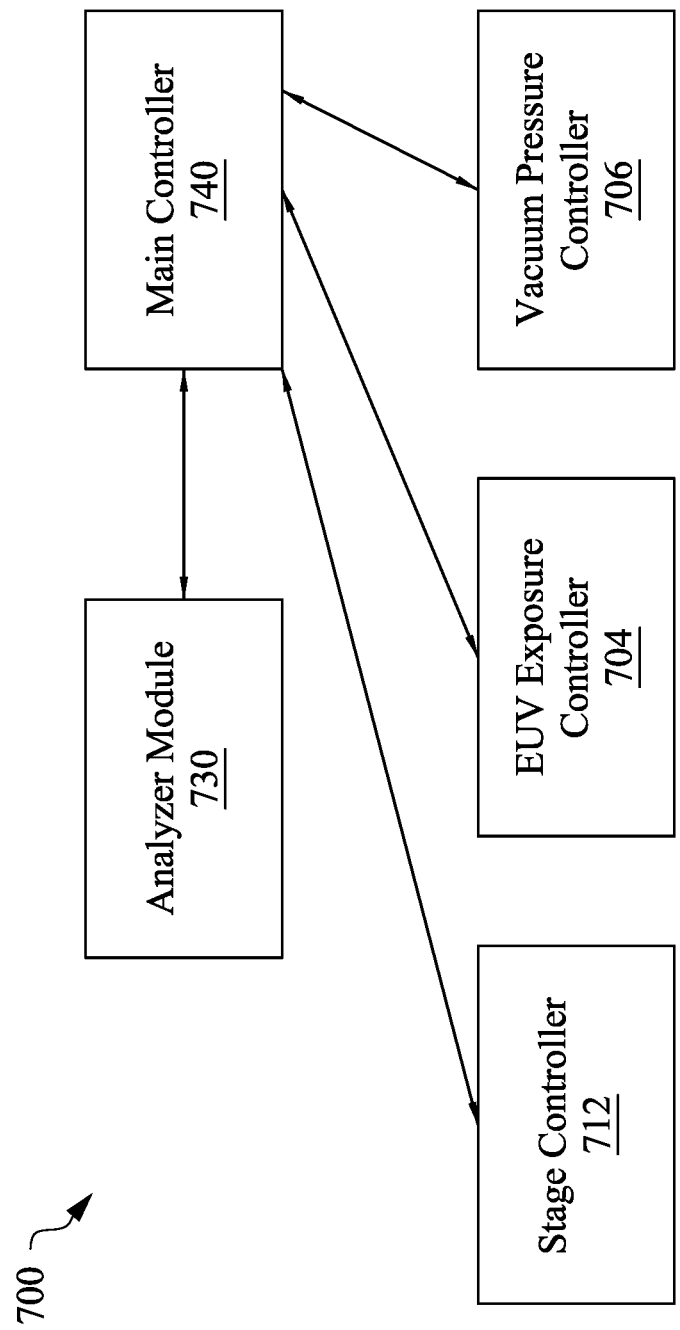
FIG. 7 shows a control system for determining a threshold number of holes on the frame of the reticle structure in in accordance with some embodiments of the present disclosure.

FIG. 7 shows a control system for determining a threshold number of holes and/or a threshold total area of coverage of the holes on the frame 504 of the reticle structure in accordance with some embodiments of the present disclosure. The system 700 includes an analyzer module 730 and a main controller 740 coupled to each other. The system 700 also includes a vacuum pressure controller 706 that is coupled to the analyzer module 730 through the main controller 740. In some embodiments, the analyzer module 730 receives, from a vacuum pressure controller 706 that is consistent with the vacuum pressure controller 206, a pressure of inside the exposure device 200 of FIGS. 1 and 2 and a pressure, e.g., atmospheric pressure, of outside the exposure device 200. The vacuum pressure controller 706 also receives a pressure of inside the reticle structure 350, e.g., inside the enclosure 555 of FIG. 5A that is surrounded by the frame 504, when the reticle structure is placed inside the exposure device 200 and the pressure is equalized. The vacuum pressure controller 706 also receives the pressure of inside the reticle structure 350 when the reticle structure is placed outside the exposure device 200 and the pressure is equalized. The analyzer module 730 determines the pressure difference between inside the enclosure 555 and outside the enclosure 555. The analyzer module 730 may determine the threshold number of holes and/or the threshold total area of coverage of the holes on the frame of the reticle structure 350 based on a threshold pressure difference between inside the enclosure 555 and outside the enclosure 555.

In some embodiments, between inside the enclosure 555 and outside the enclosure 555 and/or the threshold total area of coverage of the holes on the frame is modified and the equalized pressure difference between inside the enclosure 555 and outside the enclosure 555 is measured. In some embodiments, a graph, e.g., the graph 610 of FIG. 6, is generated based on the measurements. The threshold number of holes is determined based on the threshold pressure difference using the graph 610. In some embodiments, the number of holes include the shape, size (e.g., a length, width, or radius) of the holes, and location, e.g., height from the reticle 80, of the holes. In some embodiments, the threshold number of holes are determined based on a maximum acceptable, e.g., tolerated, pressure difference between inside the enclosure 555 and outside the enclosure 555.

In some embodiments, the vacuum pressure controller 206 provides the pressure of inside the exposure device 200 and the pressure of inside of enclosure 555. The system 700 includes an EUV exposure controller 704 that is coupled to the analyzer module 730 through the main controller 740. The EUV exposure controller 704 controls the intensity of the EUV radiation, e.g., the intensity of the radiation beam 50 of FIG. 3B. The system 700 also includes a stage controller 712 that is coupled to the analyzer module 730 through the main controller 740. The stage controller 712 is consistent with the stage controller 365 of FIG. 3B. Referring to FIG. 3B, the stage controller 712 is used for moving the semiconductor device 34 of FIG. 3B and exposing different locations of the semiconductor device 34 by the radiation beam 50 during the lithographic process.

Figure 8B:
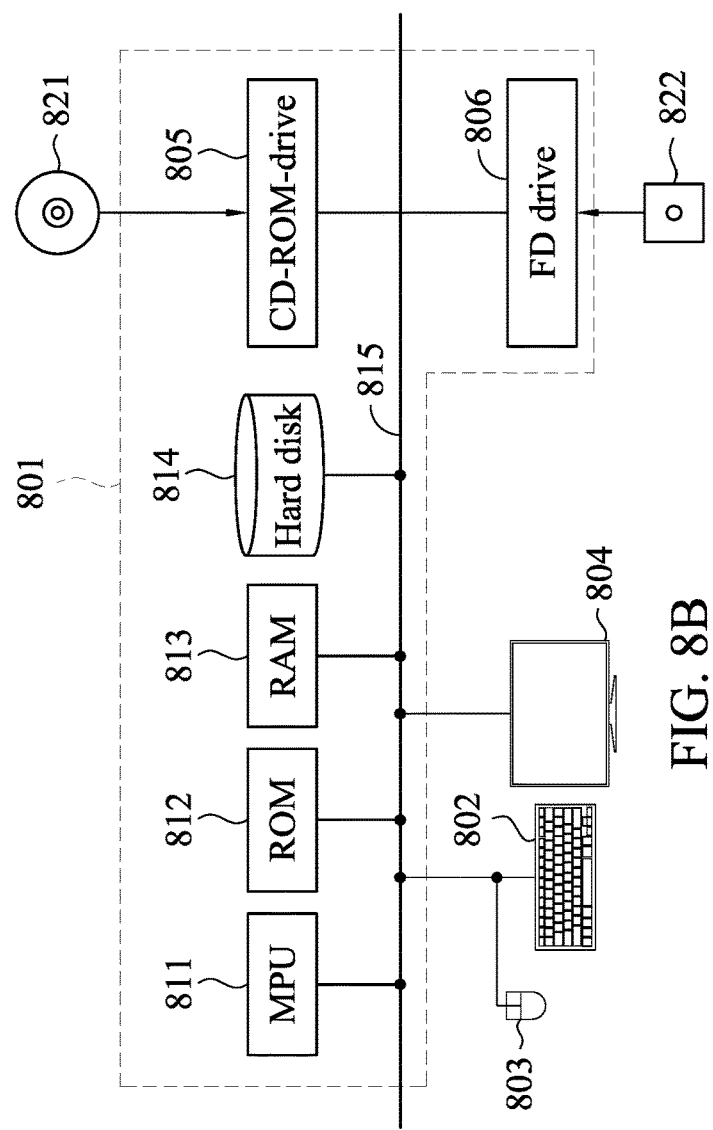
FIGS. 8A and 8B illustrate an apparatus for determining the threshold number of holes on the frame of the reticle structure in accordance with some embodiments of the present disclosure.
Figure 8A:
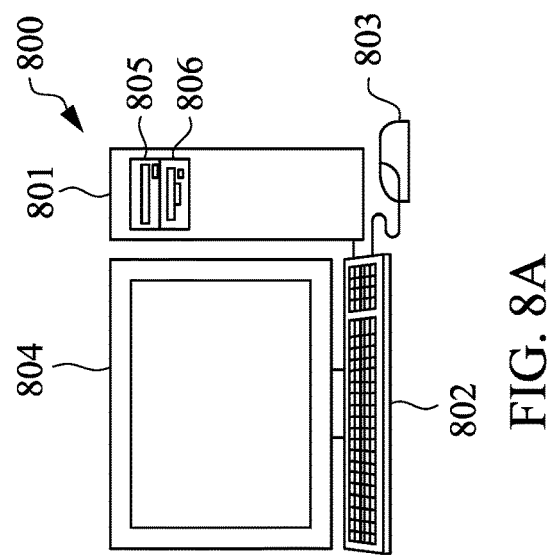

FIGS. 8A and 8B illustrate an apparatus for determining the threshold number of holes on the frame 504 of the reticle structure 350 in accordance with some embodiments of the present disclosure. FIG. 8A is a schematic view of a computer system 800 that generates the graph 610 of FIG. 6. The computer system 800 may also determine the threshold number of holes of the frame 504 of the reticle structure 350 of FIG. 3A. All of or a part of the processes, method and/or operations of the foregoing embodiments can be realized using computer hardware and computer programs executed thereon. In some embodiments, the computer system 800 provides the functionality of the EUV exposure controller 704, the analyzer module 730, the main controller 740, the stage controller 712, and the vacuum pressure controller 706. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. In FIG. 8B, the computer 801 is provided with, in addition to the optical disk drive 805 and the magnetic disk drive 806, one or more processors 811, such as a micro-processor unit (VIPU), a ROM 812 in which a program such as a boot up program is stored, a random access memory (RAM) 813 that is connected to the processors 811 and in which a command of an application program is temporarily stored and a temporary storage area is provided, a hard disk 814 in which an application program, a system program, and data are stored, and a bus 815 that connects the processors 811, the ROM 812, and the like. Note that the computer 801 may include a network card (not shown) for providing a connection to a LAN.

The program for causing the computer system 800 to determine the threshold number of holes on the frame 504 of the reticle structure 350 in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the process for manufacturing the lithographic mask of a semiconductor device in the foregoing embodiments. The program may only include a command portion to call an appropriate function (module) in a controlled mode and obtain desired results.

Figure 9A:
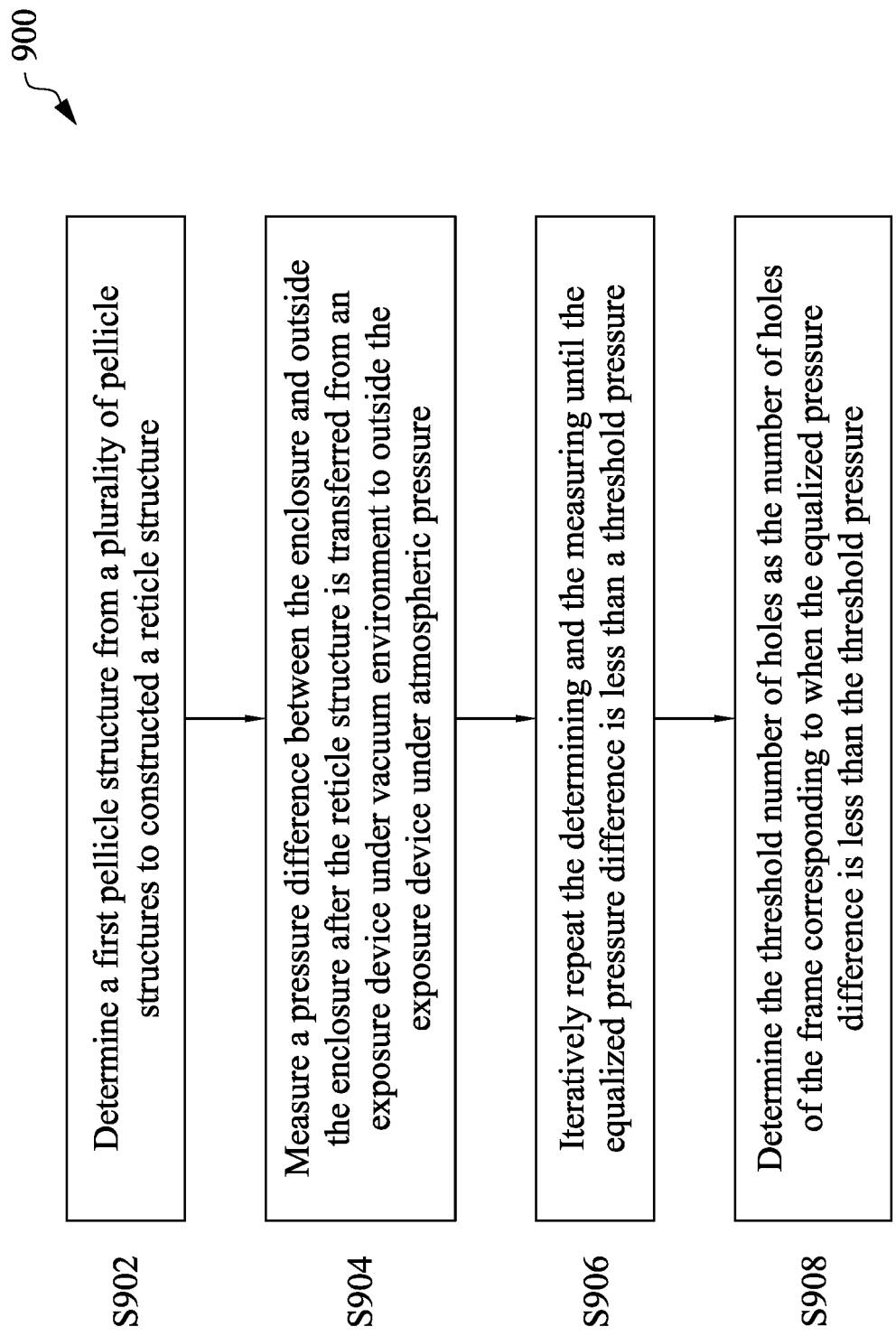
FIGS. 9A and 9B illustrate a flow diagram of a process for determining a threshold number of holes for a reticle structure and a process for providing a pellicle structure in accordance with some embodiments of the disclosure.
Figure 9B:
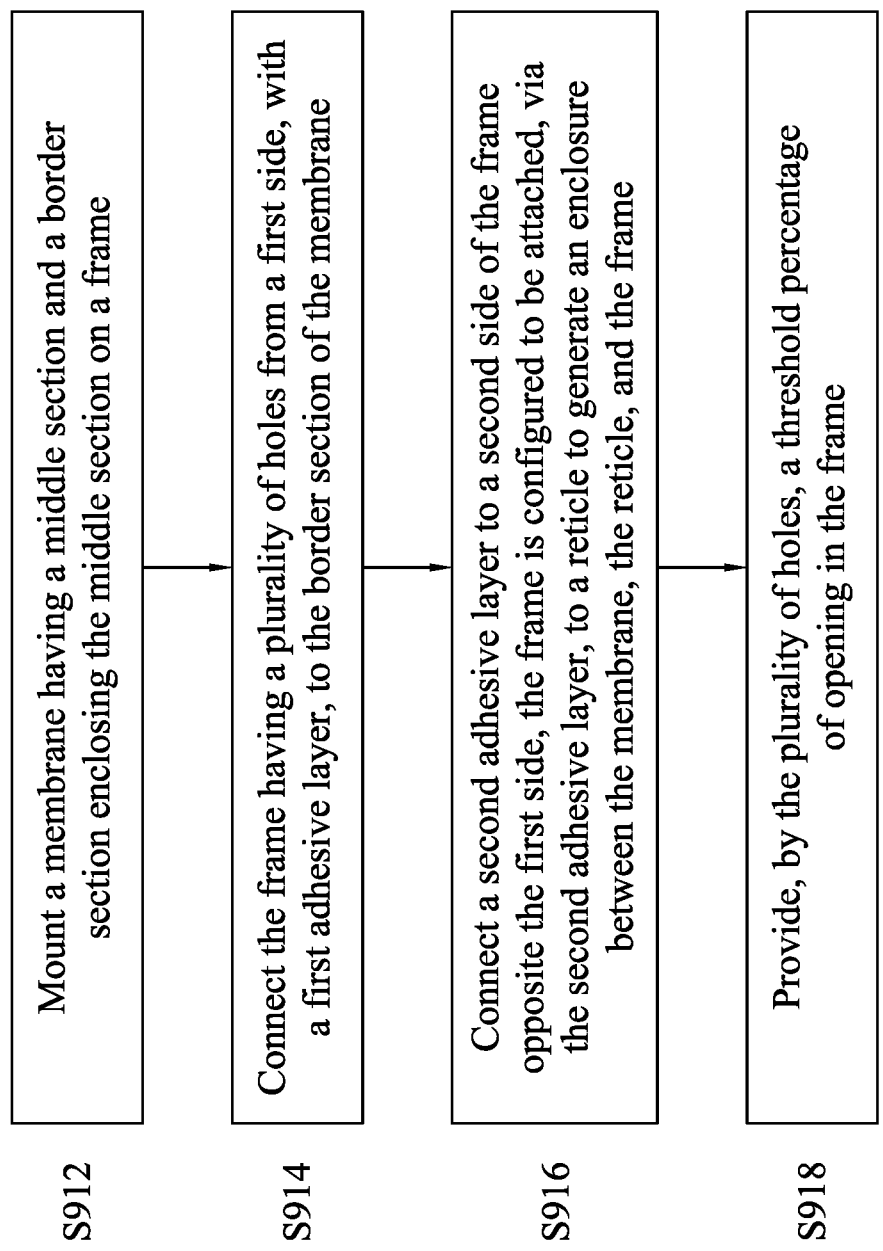

FIGS. 9A and 9B illustrate a flow diagram of a process 900 for determining a threshold number of holes for a reticle structure and a process 950 for providing a pellicle structure in accordance with some embodiments of the disclosure. The process 900 or a portion of the process 900 may be performed by the system of FIG. 2. In some embodiments, the process 900 or a portion of the process 900 is performed and/or is controlled by the computer system 800 described above with respect to FIGS. 8A and 8B. In some embodiments, the process 900 or a portion of the process 900 is performed by the system 700 of FIG. 7 described above. The process includes an operation S902, where a first pellicle structure from a plurality of pellicle structures is determined to construct a reticle structure, e.g., to construct the reticle structure 350 of FIGS. 3A and 5A. As shown, the reticle structure 350 includes the reticle 80 and the pellicle structure 70 mounted over the reticle 80. Each pellicle structure 70 of the plurality of pellicle structures includes the membrane 65 and the frame 504 of FIG. 5A or the frame 75 of FIG. 3A that is disposed between the reticle 80 and the membrane 65 to mount the membrane 65 over the reticle 80. In some embodiments, the frame 75 encircles the patterned features 55 of the reticle 80. In some embodiments, the frame 504 produces the enclosure 555 between the reticle 80 and the membrane 65. In some embodiments, the frame 504 of each pellicle structure 70 of the plurality of pellicle structures has a different number of holes. The frame of the first pellicle structure has a first number of holes.

In operation S904, a pressure difference between the enclosure 555 and outside the enclosure 555 is measured. The pressure difference is measured after the reticle structure 350 is transferred from an exposure device, e.g., exposure device 200 of FIG. 2, under vacuum environment, to outside the exposure device 200, under atmospheric pressure. In some embodiments, the pressure difference is measured after transferring the reticle structure 350 and after a delay, e.g., between 10 seconds and 30 seconds, until the pressure difference is equalized, e.g., settled.

In operation S906, the above steps of determining and measuring is iteratively repeated until the equalized pressure difference becomes less than a threshold pressure. In each determining step, a different pellicle structure is selected such that the different pellicle structure has a frame with more number of holes. In some embodiments, the holes have circular shape with a diameter of 2 mm. The frame of the first pellicle structure has 100 holes and in each interaction the number of holes is increased between 5 to 10 percent until the measured equalized pressure difference becomes less than the threshold pressure of 3.5 Pascal. The graph 610 of FIG. 6 shows the equalized pressure difference versus the number of holes of the frame 504 of the reticle structure 350.

In operation S908, the number of holes of the frame corresponding to when the equalized pressure difference is less than the threshold pressure is determined as the threshold number of holes. As shown in FIG. 6, the threshold number of holes is 150. In some embodiments, instead of defining the number of holes or the threshold number of holes a percentage of opening in the frame 504 of the reticle structure 350 and a threshold percentage of opening is determined. In some embodiments, a number of holes per unit area and a threshold number of holes per unit area is used.

The process 950 of FIG. 9B provides a pellicle structure shown in FIG. 5A, 5B, or 5C. The process includes an operation S912, where a membrane having a middle section and a border section enclosing the middle section is mounted over a frame. As shown in FIGS. 5A, 5B, and 5C, the membrane 65 is mounted over the frame 504. In operation S914, the frame having a plurality of holes is connected with a first adhesive layer to border section of the membrane. As shown in FIGS. 5A and 5B, the frame having the plurality of holes 510, 520, and 530 is connected to the border section 402 of the membrane 65 via the first adhesive layer 506. In operation S916 a second adhesive layer is connected to a second side of the frame opposite the first side of the frame. The frame is configured to attach to a reticle via the second adhesive layer to generate an enclosure between the membrane, the reticle, and the frame. As shown in FIG. 5B, the frame 504 may be attached to the reticle 80 and the enclosure 555 may be created. In operation S918, a threshold percentage of opening in the frame is provided by the plurality of hole. In some embodiments, the threshold percentage of opening maintains an equalized pressure difference, below a threshold pressure, between a volume inside the enclosure and outside the enclosure.

In some embodiments, the frame material is Si, SiC, SiN or Glass. In some embodiments, the frame material is an Al-alloy, a Ti alloy, an Invar, or a Kovar. In some embodiments, the holes are is at the top, at the bottom, or at the center of the frame 504. The holes have varied shapes including a circular or rectangular shape. In some embodiments, the holes include a filter to prevent outside particles from penetrating into inner enclosure and becoming mask fall-on defects. In some embodiments, the adhesive 506 is a double-sided adhesive and is Si, acrylic, or an epoxy type gel.

According to some embodiments of the present disclosure, a lithography system includes a reticle structure that includes a reticle having patterned features, a membrane, and a frame disposed between the membrane and the reticle and to mount the membrane over the patterned features of the reticle. The frame encircles the patterned features and produces an enclosure between the reticle and the membrane. The frame includes a plurality of holes and a number of the plurality of holes are more than a threshold number of holes to maintain an equalized pressure difference between the enclosure and outside the enclosure below a threshold pressure. The lithography system further includes an exposure device that includes a radiation source to emit a radiation beam to reflect and/or project the patterned features of the reticle onto a substrate. The exposure device further includes one or more mirrors to guide reflected and/or projected patterned features onto the substrate. In an embodiment, the plurality of holes produce an opening for passage of gas between the enclosure and outside the enclosure. The opening equalizes pressure between the enclosure and outside the enclosure when the reticle structure is transferred between atmospheric pressure outside the exposure device and a vacuum environment inside the exposure device. In an embodiment, the holes have a circular shape with a diameter of 1 mm. The threshold number of holes maintains an equalized pressure difference between the enclosure and outside the enclosure where the threshold pressure is 3.5 Pascal. In an embodiment, the lithography system includes an air filter disposed in one or more holes of the plurality of holes to prevent particles outside the enclosure from entering into the enclosure. In an embodiment, the holes have circular shape with a diameter between 1 mm and 2 mm, a number of the holes is between 150 holes and 200 holes, and the threshold pressure is 2.5 Pascal. In an embodiment, the membrane includes a middle section and a first border section enclosing the middle section. A border layer is disposed over the first border section. The membrane is transparent to the radiation beam emitted by the radiation source, and a material of the border layer includes silicon (Si) and a material of the membrane includes polysilicon, silicide, or graphite, and a frame material includes Si, SiC, SiN, or glass. In some embodiments, the material of the border layer is not transparent to DUV or EUV radiation.

Another layer that includes one or more of elements Ru, Mo, Zr, B, Nb, Ir, Ti, the oxide of the elements, or the oxynitride of the elements is disposed over the membrane on opposite side of the border layer for heat dissipation. In an embodiment, the reticle includes a second border section enclosing the patterned features. The frame is connected between the border layer on the first border section of the membrane and the second border section of the reticle. In an embodiment, a first side of the frame is attached with an adhesive layer to the border layer on the first border section of the membrane and a second side of the frame is attached with another adhesive layer to the second border section of the reticle, and the frame is closed around the patterned features.

According to some embodiments of the present disclosure, a reticle structure includes a reticle having patterned features and a first border section enclosing the patterned features and a membrane having a middle section a second border section enclosing the middle section. The reticle structure further includes a frame disposed between the membrane and the reticle to mount the membrane over the patterned features of the reticle. The frame creates an enclosure between the reticle and the membrane and encircles the patterned features of the reticle. The frame includes a plurality of holes and the plurality of holes produces a threshold percentage of opening in the frame to maintain an equalized pressure difference between the enclosure and outside the enclosure below a threshold pressure. In an embodiment, the threshold percentage of opening in the frame maintains the equalized pressure difference between the enclosure and outside the enclosure below the threshold pressure when the reticle structure is transferred between a vacuum environment and an atmospheric pressure environment. In an embodiment, the frame is closed around the patterned features and the plurality of holes of the frame provide a passage for gas transfer between the enclosure and outside the enclosure to equalize a pressure between the enclosure and outside the enclosure. In an embodiment, the reticle structure includes an air filter disposed in one or more holes of the plurality of holes to prevent particles outside the enclosure from entering the enclosure. In an embodiment, a top side of the frame is attached with an adhesive layer to a border layer disposed on the second border section of the membrane and a bottom side of the frame is attached with another adhesive layer to the first border section of the reticle. The membrane is transparent to DUV or EUV radiation. In an embodiment, a thickness of the membrane is between about 30 nm and about 100 nm, and a thickness of the frame is between about 2 mm and about 4 mm. In an embodiment, the threshold percentage of opening is 25 percent and the threshold pressure is 3.5 Pascal.

According to some embodiments of the present disclosure, a method of providing a pellicle structure includes mounting a membrane over a frame. The frame has a middle section and a border section enclosing the middle section. The method also includes connecting the frame that includes a plurality of holes from a first side, with a first adhesive layer, to the border section of the membrane. The middle section of the membrane is transparent to DUV or EUV radiation. The method further includes connecting a second adhesive layer to a second side of the frame opposite the first side of the frame. The frame is configured to be attached, via the second adhesive layer, to a reticle to generate an enclosure between the membrane, the reticle, and the frame. The method further includes providing, by the plurality of holes, a threshold percentage of opening in the frame to maintain an equalized pressure difference, below a threshold pressure, between a volume inside the enclosure and outside the enclosure. In an embodiment, the method further includes providing a passage for gas between inside the enclosure and outside the enclosure through the plurality of holes. In an embodiment, the method further includes providing an air filter in one or more of the plurality of holes to prevent particles from moving through the holes. In an embodiment, the first adhesive layer and the second adhesive layer are double sided adhesive layers, the plurality of holes have circular shape with a diameter between about 0.5 mm and 1 mm, the plurality of holes are uniformly distributed over the frame, and the threshold percentage of opening is 25 percent and the threshold pressure is 2.5 Pascal. In an embodiment, the method further includes disposing a border layer over the border section of the membrane between the border section of the membrane and the first adhesive layer and a material of the border layer includes silicon (Si) and a material of the membrane includes polysilicon, silicide, or graphite.

In some embodiments, implementing the processes and methods mentioned above, increases the durability of the reticle structure and improves the quality and stability of the pellicle of the reticle structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A reticle structure, comprising:
a reticle having patterned features and a first border section enclosing the patterned features;
a membrane having a middle section and a second border section enclosing the middle section; and
a frame disposed between the membrane and the reticle and configured to mount the membrane over the patterned features of the reticle,
wherein the frame creates an enclosure between the reticle and the membrane and encircles the patterned features of the reticle, wherein the frame comprises a plurality of holes, wherein the plurality of holes produce a percentage of opening greater than a threshold percentage of opening in the frame to maintain an equalized pressure difference between the enclosure and outside the enclosure below a threshold pressure difference, and wherein the plurality of holes include at least one slit-shaped hole that has one side formed by the second border section of the membrane and three other sides formed by the frame.

2. The reticle structure of claim 1, wherein the threshold percentage of opening in the frame is configured to maintain the equalized pressure difference between the enclosure and outside the enclosure below the threshold pressure difference when the reticle structure is transferred between a vacuum environment and an atmospheric pressure environment.

3. The reticle structure of claim 2, wherein the frame is closed around the patterned features, and wherein the plurality of holes of the frame provide a passage for gas transfer between the enclosure and outside the enclosure to equalize the pressure difference between the enclosure and outside the enclosure.

4. The reticle structure of claim 2, further comprising:
an air filter disposed in one or more holes of the plurality of holes to prevent particles outside the enclosure from entering the enclosure.

5. The reticle structure of claim 1, wherein a top side of the frame is attached with an adhesive layer to a border layer disposed on the second border section of the membrane and a bottom side of the frame is attached with another adhesive layer to the first border section of the reticle, wherein the membrane is transparent to DUV or EUV radiation.

6. The reticle structure of claim 1, wherein a thickness of the membrane is between about 30 nm and about 100 nm, and wherein a thickness of the frame is between about 2 mm and about 4 mm.

7. The reticle structure of claim 1, wherein the threshold percentage of opening is 25 percent and the threshold pressure difference is 3.5 Pascal.

8. A method, comprising:
mounting a membrane over a frame, wherein the membrane comprises a middle section and a border section enclosing the middle section;
connecting the frame comprising a plurality of holes from a first side, with a first adhesive layer, to the border section of the membrane, wherein the frame encircles the middle section of the membrane, and wherein the middle section of the membrane is transparent to DUV or EUV radiation;
connecting a second adhesive layer to a second side of the frame opposite the first side of the frame, wherein the frame is configured to be attached, via the second adhesive layer, to a reticle to generate an enclosure between the membrane, the reticle, and the frame; and
providing, by the plurality of holes, a threshold percentage of opening in the frame,
wherein the threshold percentage of opening maintains an equalized pressure difference, below a threshold pressure difference, between a volume inside the enclosure and outside the enclosure, and wherein the plurality of holes include at least one slit-shaped hole that has one side formed by the reticle, one side formed by the frame, and two sides formed by the frame and the second adhesive layer.

9. The method of claim 8, further comprising:
mounting an air filter in one or more of the plurality of holes to prevent particles from moving through the holes.

10. The method of claim 8, further comprising:
disposing a border layer over the border section of the membrane between the border section of the membrane and the first adhesive layer, wherein a material of the border layer comprises silicon (Si), and wherein a material of the membrane comprises polysilicon, silicide, or graphite.

11. The method of claim 8, further comprising:
providing a passage for gas transfer between inside the enclosure and outside the enclosure through the plurality of holes.

12. The method of claim 8, wherein:
the first adhesive layer and the second adhesive layer are double sided adhesive layers,
the plurality of holes have circular shape with a diameter between 0.5 mm and 1 mm,
the plurality of holes are uniformly distributed over the frame, and the threshold percentage of opening is 25 percent and the threshold pressure difference is 2.5 Pascal.

13. A reticle structure, comprising:
a reticle having patterned features;
a membrane; and
a frame disposed between the membrane and the reticle and configured to mount the membrane over the patterned features of the reticle, wherein:
the frame encircles the patterned features and produces an enclosure between the reticle and the membrane,
the frame comprises a plurality of holes,
a number of the plurality of holes are more than a threshold number of holes to maintain an equalized pressure difference between the enclosure and outside the enclosure below a threshold pressure difference, and
the plurality of holes include at least one slit-shaped hole that has three sides formed by the frame and one side formed by a border section of the membrane.

14. The reticle structure of claim 13, wherein:
the plurality of holes are configured to produce an opening for passage of gas between the enclosure and outside the enclosure, and
the opening is configured to equalize the pressure difference between the enclosure and outside the enclosure when the reticle structure is transferred between outside an exposure device and a vacuum environment inside an exposure device.

15. The reticle structure of claim 14, wherein:
the holes have a circular shape with a diameter of 1 mm,
the threshold number of holes are configured to maintains an equalized pressure difference between the enclosure and outside the enclosure, and
the threshold pressure is 3.5 Pascal.

16. The reticle structure of claim 15, further comprising:
an air filter disposed in one or more holes of the plurality of holes to prevent particles outside the enclosure from entering into the enclosure.

17. The reticle structure of claim 15, wherein:
the holes have circular shape with a diameter between 1 mm and 2 mm,
a number of the holes is between 150 holes and 200 holes, and
the threshold pressure difference is 2.5 Pascal.

18. The reticle structure of claim 13, wherein:
the membrane comprises a middle section and a first border section enclosing the middle section,
a border layer is disposed over the first border section,
the membrane is transparent to an EUV radiation,
a material of the border layer comprises silicon (Si) and a material of the membrane comprises polysilicon, silicide, or graphite,
a frame material comprises Si, SiC, SiN, or glass, and
another layer comprising one or more of elements Ru, Mo, Zr, B, Nb, Ir, Ti, oxide thereof, or oxynitride thereof is disposed over the membrane on opposite side of the border layer for heat dissipation.

19. The reticle structure of claim 18, wherein:
the reticle further comprises a second border section enclosing the patterned features, and
the frame is connected between the border layer on the first border section of the membrane and the second border section of the reticle.

20. The reticle structure of claim 19, wherein a first side of the frame is attached with an adhesive layer to the border layer on the first border section of the membrane and a second side of the frame is attached with another adhesive layer to the second border section of the reticle, and wherein the frame is closed around the patterned features.

* * * * *